US012696712B2

(12) United States Patent
Morita et al.

(10) Patent No.: US 12,696,712 B2
(45) Date of Patent: Jul. 28, 2026

(54) SUBSTRATE PROCESSING APPARATUS AND SUBSTRATE PROCESSING METHOD

(71) Applicant: KIOXIA CORPORATION, Tokyo (JP)

(72) Inventors: Takaumi Morita, Kuwana Mie (JP);
Hiroshi Fujita, Mie Mie (JP);
Tatsuhiko Koide, Kuwana Mie (JP);
Naomi Yanai, Kuwana Mie (JP);
Tsubasa Watanabe, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 751 days.

(21) Appl. No.: 17/898,143

(22) Filed: Aug. 29, 2022

(65) Prior Publication Data

US 2023/0307265 A1      Sep. 28, 2023

(30) Foreign Application Priority Data

Mar. 22, 2022      (JP) ................................. 2022-046099

(51) Int. Cl.
*H10P 72/00*           (2026.01)
(52) U.S. Cl.
CPC ............................... *H10P 72/0426* (2026.01)
(58) Field of Classification Search
CPC ................................................. H01L 21/67086
See application file for complete search history.

(56) References Cited

U.S. PATENT DOCUMENTS 6,807,974 B2 * 10/2004 Ono ....................... H01L 21/681
134/144
9,280,063 B2 * 3/2016 Kunnen ................... G03F 7/707

10,153,176 B2   12/2018 Soda
10,423,066 B2    9/2019 Izawa et al.
10,796,948 B2   10/2020 Mitra et al.
10,845,609 B2   11/2020 Ahmed et al.
11,088,164 B2    8/2021 Shimizu
2018/0239261 A1 *  8/2018 Mizutani ................. G03F 7/709
(Continued)

FOREIGN PATENT DOCUMENTS

CN            1184557 A  * 6/1998   ....... H01L 21/67057
CN         102736446 B  * 9/2014   ........... G03F 7/7085
(Continued)

OTHER PUBLICATIONS

Japanese Office Action dated May 13, 2025, mailed in counterpart Japanese Application No. 2022-046099, 10 pages.

*Primary Examiner* — Mohammed Shamsuzzaman
(74) *Attorney, Agent, or Firm* — Kim & Stewart LLP

(57) ABSTRACT

According to one embodiment, a substrate processing apparatus includes a processing tank configured to store a chemical solution for processing a substrate by immersion in a chemical solution. The substrate is held by a holding member during the processing. A lid is configured to open and close an upper end portion of the processing tank. The lid has a first bubble dispensing pipe formed or integrated therein. The first bubble dispensing pipe is configured to dispense a gas into the processing tank. A bottom surface side of the lid on a processing tank side may come into direct contact with the chemical solution in some examples. The first bubble dispensing pipe may dispense an inert gas into the chemical solution to improve process stability or the like.

8 Claims, 10 Drawing Sheets

(56)        References Cited

U.S. PATENT DOCUMENTS

| | | | | |
|---|---|---|---|---|
| 2019/0096711 A1* | 3/2019 | Ohno | ............... | H01L 21/67017 |
| 2019/0103294 A1* | 4/2019 | Masutomi | ......... | H01L 21/67086 |
| 2019/0371595 A1* | 12/2019 | Honda | ............. | H01L 21/31111 |
| 2021/0138512 A1* | 5/2021 | Takahashi | ................. | B08B 3/10 |
| 2021/0384049 A1* | 12/2021 | Bassett | ............ | H01L 21/67057 |
| 2022/0285166 A1* | 9/2022 | Honda | ............. | H01L 21/30604 |

FOREIGN PATENT DOCUMENTS

| | | | | | |
|---|---|---|---|---|---|
| CN | 106783695 A | * | 5/2017 | ....... | H01L 21/67034 |
| CN | 217361512 U | * | 9/2022 | ....... | H01L 21/67265 |
| CN | 116544134 A | * | 8/2023 | ....... | H01L 21/67057 |
| CN | 117457527 A | * | 1/2024 | ....... | H01L 21/67757 |
| DE | 19832038 A1 | * | 1/1999 | ............. | B08B 3/10 |
| JP | H06140377 A | | 5/1994 | | |
| JP | H0790628 A | | 4/1995 | | |
| JP | H10242106 A | * | 9/1998 | ....... | H01L 21/67086 |
| JP | H11102888 A | | 4/1999 | | |
| JP | 2000005710 A | | 1/2000 | | |
| JP | 2000091286 A | * | 3/2000 | ....... | H01L 21/67242 |
| JP | 2000308857 A | * | 11/2000 | ....... | H01L 21/67086 |
| JP | 2001223194 A | | 8/2001 | | |
| JP | 2002176026 A | | 6/2002 | | |
| JP | 2003109934 A | * | 4/2003 | ....... | H01L 21/67242 |
| JP | 2003282518 A | * | 10/2003 | | |
| JP | 2004006616 A | * | 1/2004 | ....... | H01L 21/67057 |
| JP | 2004023048 A | * | 1/2004 | | |
| JP | 2006156428 A | * | 6/2006 | ....... | H01L 21/67086 |
| JP | 2012076313 A | * | 4/2012 | ....... | H01L 21/67086 |
| JP | 2014011202 A | * | 1/2014 | ....... | H01L 21/67086 |
| JP | 2014082472 A | * | 5/2014 | ....... | H01L 21/67086 |
| JP | 2014115356 A | * | 6/2014 | ....... | H01L 21/67057 |
| JP | 2015137374 A | * | 7/2015 | ....... | H01L 21/67253 |
| JP | 2019067995 A | | 4/2019 | | |
| JP | 2019192708 A | | 10/2019 | | |
| JP | 2021009988 A | | 1/2021 | | |
| JP | 2021106254 A | | 7/2021 | | |
| JP | 2021180253 A | * | 11/2021 | ........ | H01L 21/6708 |
| JP | 2022077385 A | * | 5/2022 | ....... | H01L 21/67242 |
| JP | 2022133947 A | * | 9/2022 | ....... | H01L 21/67075 |
| KR | 20090038279 A | * | 4/2009 | ....... | H01L 21/67086 |
| KR | 20110095180 A | * | 8/2011 | ......... | G03F 7/70716 |
| KR | 102099267 B1 | * | 5/2020 | ....... | H01L 21/67057 |
| KR | 20240034630 A | * | 3/2024 | ....... | H01L 21/67086 |
| TW | I754164 B | * | 2/2022 | ....... | H01L 21/67086 |
| TW | I754346 B | * | 2/2022 | ....... | H01L 21/67253 |
| TW | 202224008 A | * | 6/2022 | ....... | H01L 21/67017 |
| TW | I781496 B | * | 10/2022 | ....... | H01L 21/67086 |
| TW | 202314844 A | * | 4/2023 | ....... | H01L 21/32134 |
| WO | WO-2005122221 A1 | * | 12/2005 | ........... | G03F 7/7085 |
| WO | WO-2016204143 A1 | * | 12/2016 | ....... | H01L 21/67242 |
| WO | WO-2023228774 A1 | * | 11/2023 | ............... | C23F 1/08 |

* cited by examiner

1

1

1a

1a 30a  31a 32a  33a

SUBSTRATE PROCESSING APPARATUS AND SUBSTRATE PROCESSING METHOD

CROSS-REFERENCE TO RELATED APPLICATION(S)

This application is based upon and claims the benefit of priority from Japanese Patent Application No. 2022-046099, filed Mar. 22, 2022, the entire contents of which are incorporated herein by reference.

FIELD

Embodiments described herein relate generally to a substrate processing apparatus and a substrate processing method for semiconductor device related applications or the like.

BACKGROUND

A substrate processing apparatus is used to perform various processing such as etching and substrate cleaning on various substrates such as a semiconductor wafer, a glass substrate for a photomask, a substrate for a display, and a substrate for an optical disc. The substrate processing apparatus may be a batch type that processes a large number of substrates at the same time or a single wafer type that processes individual substrates one at a time.

DETAILED DESCRIPTION

Figure 1:
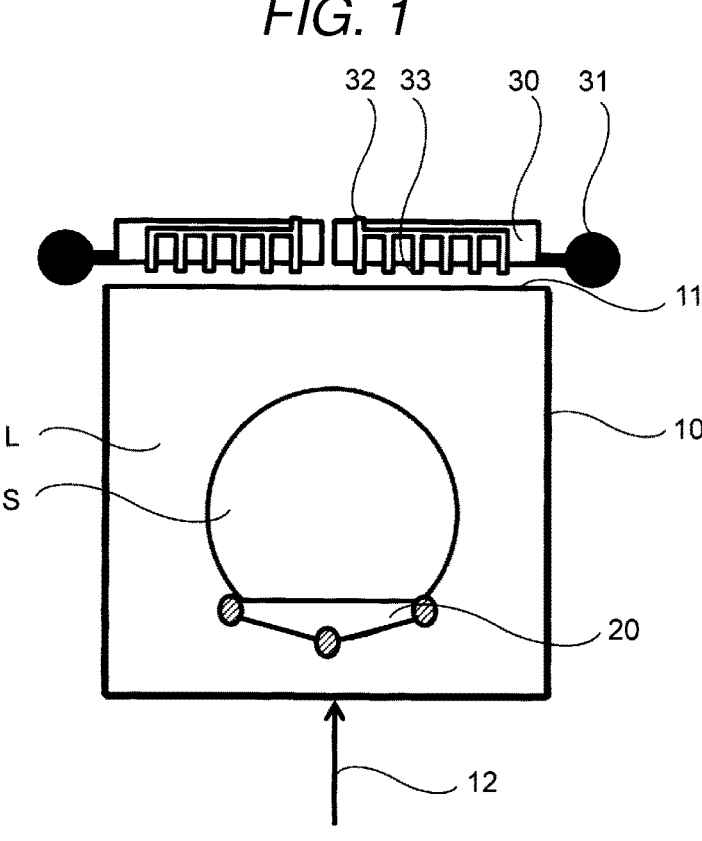
FIG. 1 is a diagram schematically illustrating a substrate processing apparatus according to an embodiment.
Figure 1:
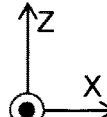

Embodiments provide a substrate processing apparatus and a substrate processing method for preventing surface oxidation of a substrate by reducing a concentration of dissolved oxygen in a processing liquid.

In general, according to one embodiment, a substrate processing apparatus includes a processing tank. The processing tank is configured to store a chemical solution to process a substrate by immersion of the substrate in the chemical solution. A holding member is configured to hold the substrate while immersed in the chemical solution. A lid is disposed on processing tank for opening and closing an upper end of the processing tank. A first bubble dispensing pipe is in the lid. The first bubble dispensing pipe is configured to dispense a gas into the processing tank.

Hereinafter, a substrate processing apparatus and a substrate processing method according to certain example embodiment will be described with reference to the drawings. In the following description, elements having substantially the same functions and configurations are denoted by the same reference numerals or reference numerals to which alphabetic characters are appended, and the description will be repeated only when necessary. Each embodiment is described for explaining the technical concepts of the present disclosure. Various modifications can be made to the specific example embodiments without departing from the scope of the present disclosure.

In order to make the description clearer, a width, a thickness, a shape, and the like of each part may be schematically illustrated in the drawings in a manner differing from an actual aspect or differing from drawing to drawing, but these are merely explanatory examples, and should not be considered to limit the present disclosure.

In the present specification, the expression that "α includes A, B, or C" does not exclude a case in which α includes any possible combination of A, B, or C unless otherwise specified. Further, these expressions do not exclude a case in which α includes other elements in addition to A, B, or C.

In the present specification, a term "horizontal" means a direction (an XY direction) horizontal to a bottom surface of a processing tank of the substrate processing apparatus, and a term "vertical" means a direction (a Z direction) substantially perpendicular to the horizontal direction.

The following example embodiments may be combined with each other as long as no technical contradiction occurs.

In the following embodiments, a semiconductor substrate such as a silicon wafer is described as an example of a substrate to be processed, but the technique of the present disclosure may be applied to a substrate other than a semiconductor substrate such as a glass substrate for a photomask, a substrate for a display device (e.g., a flat panel display substrate), or a substrate for an optical disc.

First Embodiment

[Configuration of Substrate Processing Apparatus]

Figure 2:
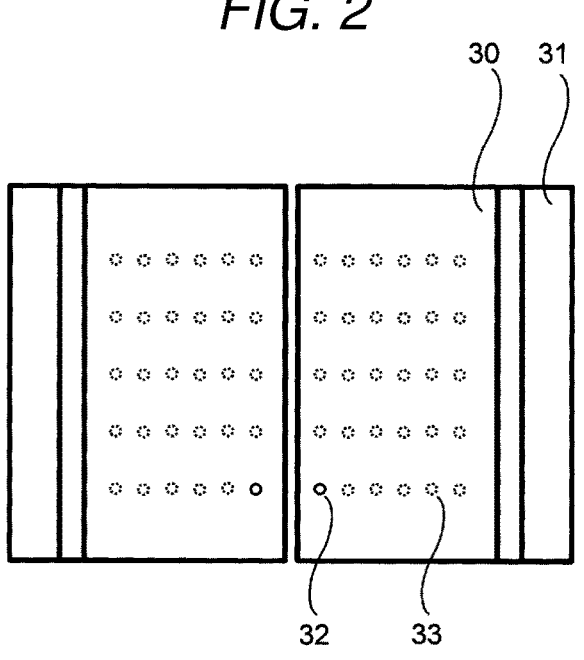
FIG. 2 is a top view schematically illustrating a structure of a substrate processing apparatus according to an embodiment.
Figure 2:
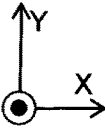

FIG. 1 is a diagram schematically illustrating an overall configuration of a substrate processing apparatus according to a first embodiment. FIG. 2 is a top view schematically illustrating a structure of the substrate processing apparatus according to the first embodiment. A substrate processing apparatus 1 according to the first embodiment is, for example, a wet etching processing apparatus for partially removing a metal wiring layer provided on a substrate S with a solution L containing an inorganic acid such as sulfuric acid, nitric acid, hydrochloric acid, and hydrofluoric acid, or an organic acid such as acetic acid and citric acid. However, the substrate processing apparatus is not limited thereto, and for example, the substrate processing apparatus may also be applied to wet etching for selectively removing silicon regions or the like of the substrate S with the solution L additionally containing hydrogen peroxide. As illustrated in FIG. 1, the substrate processing apparatus 1 includes a processing tank 10, a holding member 20, and a lid 30.

The processing tank 10 is formed in a box shape having an upper end opening 11. The processing tank 10 stores the solution L, that is, an etching liquid (or other processing liquid or chemical solution)) therein. The type, the temperature, and the concentration of the solution L stored inside the processing tank 10 can be selected for optimized etching of the substrate S. A solution supply path 12 is connected to a bottom portion of the processing tank 10. The solution supply path 12 supplies the solution L to the processing tank 10. The solution supply path 12 includes a solution dispensing port through which the solution L is supplied to the processing tank 10. The shape of the solution dispensing port is not particularly limited. The solution dispensing port is preferably disposed below the holding member 20 that holds the substrate S.

The processing tank 10 is capable of accommodating a wafer-shaped (disk-shaped) substrate S vertically (a main surface parallel to an XZ plane). For example, one processing tank 10 may accommodate a maximum of fifty (50) substrates S at one time. FIG. 1 illustrates that one substrate S is in the processing tank 10, whereas, in general, a plurality of substrates S would be accommodated side by side along the depth direction of the drawing surface (a Y direction into the page). The processing tank 10 has a depth sufficient to completely immerse the vertically accommodated substrate S in the solution L. The upper end opening 11 of the processing tank 10 is higher than an upper end portion of the vertically accommodated substrate S.

Although not illustrated in the figure (but see FIG. 13, for example), the processing tank 10 may further include an outer tank. The outer tank may surround the upper end opening 11 of the processing tank 10 over an entire periphery. The outer tank can be provided to collect any solution L overflowing from the upper end opening 11 of the processing tank 10, for example.

In the processing tank 10, the holding member 20 holds the plurality of substrates S arranged in a row in a horizontal direction (the Y direction) at predetermined intervals. Further, the holding member 20 includes an elevating mechanism that raises and lowers the substrate S in the holding member 20 in a vertical direction (a Z direction). By raising and lowering operations of the elevating mechanism, the substrates S before etching processing can be automatically immersed in the solution L stored in the processing tank 10, and the substrates S after the etching processing can be automatically taken out from the processing tank 10.

The lid 30 is provided above the processing tank 10. The lid 30 is implemented by two flat plate-shaped members, and has a double-door structure that is opened and closed by rotating the two flat plate-shaped members in opposite directions (left and right directions on the paper surface) about shafts 31. However, the lid 30 is not limited thereto, and may have a single-door structure that is opened and closed by rotating the lid 30 about a single shaft 31 or the like. The lid 30 covers the upper end opening 11 of the processing tank 10 when closed. In some examples, lid 30 may have a gap in the center where the two flat plate-shaped members (doors) meet or almost meet. The gap may be provided such that the left and right flat plate-shaped members do not interfere with each other.

As illustrated in FIGS. 1 and 2, the lid 30 includes a first bubble dispensing pipe 32. The first bubble dispensing pipe 32 is provided integrated with the lid 30. That is, flow channels or parts thereof of the first bubble dispensing piper 32 may be within the material forming the flat plate-shaped members. The first bubble dispensing pipe 32 supplies a gas G into the processing tank 10.

The first bubble dispensing pipe 32 includes a plurality of first bubble dispensing ports 33 for supplying the gas G to the processing tank 10. The plurality of first bubble dispensing ports 33 are disposed on a lower surface (a surface on a processing tank 10 side) of the lid 30. The gas G is dispensed from the first bubble dispensing ports 33 into a space above the solution L stored in the processing tank 10.

In FIG. 2, the plurality of first bubble dispensing ports 33 are uniformly arranged in a matrix on the lower surface of the lid 30. However, the number and arrangement of the first bubble dispensing ports 33 are not particularly limited. It is sufficient if the gas G can be uniformly supplied to a liquid surface of the solution L.

The gas G supplied from the first bubble dispensing pipe 32 may be, for example, a gas containing nitrogen. However, the gas G is not limited thereto, and may be another inert gas. The first bubble dispensing ports 33 are preferably uniformly arranged with respect to the liquid surface of the solution L. In this case, each of the first bubble dispensing ports 33 may supply the gas G to the processing tank 10 at substantially the same flow rate. However, the arrangement of first bubble dispensing ports 33 is not limited thereto, and may supply the gas G to the processing tank 10 at different flow rates depending on the position of the first bubble dispensing ports 33 with respect to the substrate S or the lid 30.

According to the substrate processing apparatus 1 of the first embodiment, the gas G is supplied from the first bubble dispensing ports 33 to the space above the solution L in the processing tank 10, so that of the dissolving of oxygen from the air into the solution L can be prevented (mitigated), and the amount of dissolved oxygen in the solution L during the etching processing can be reduced. Therefore, uniformity of an etching rate in the substrate S can be improved, and surface oxidation of the substrate S can be prevented.

[Substrate Processing Method]

Figure 3:
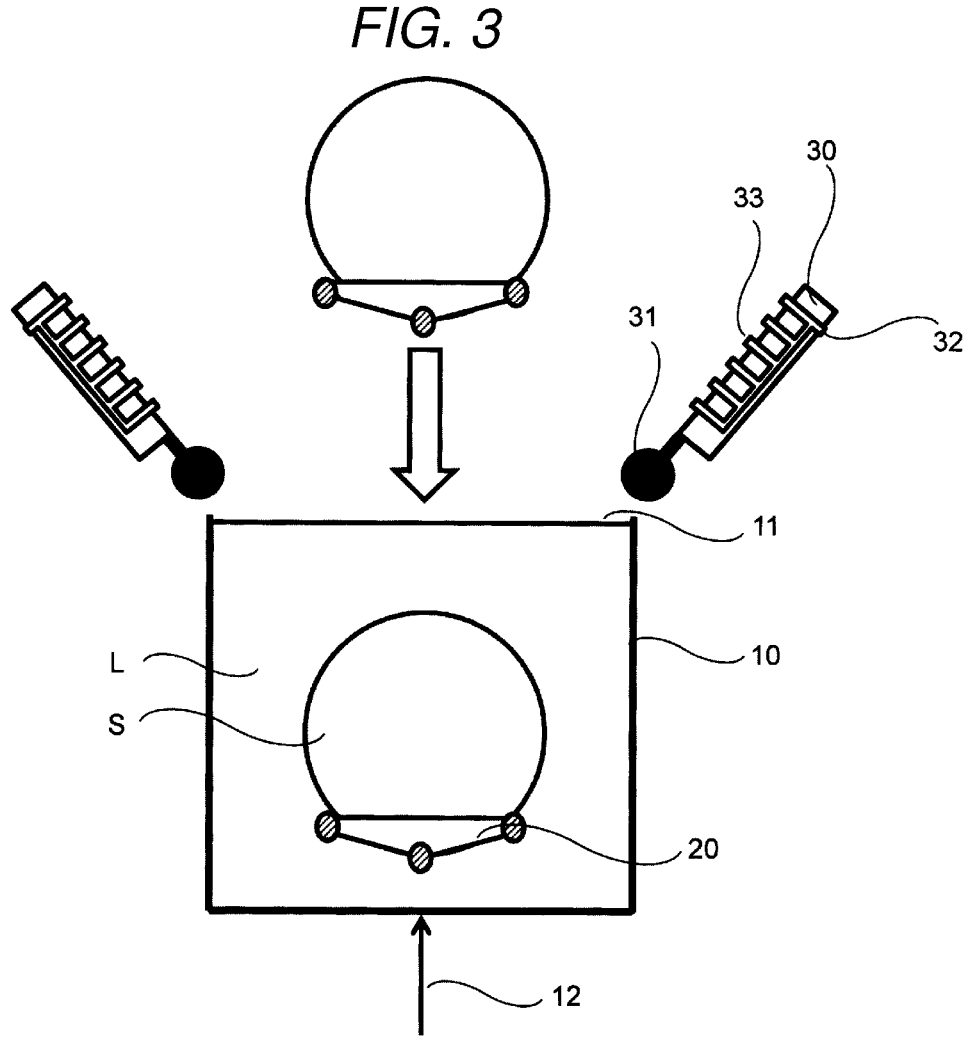
FIG. 3 is a diagram schematically illustrating aspects of a substrate processing method according to an embodiment.
Figure 4:
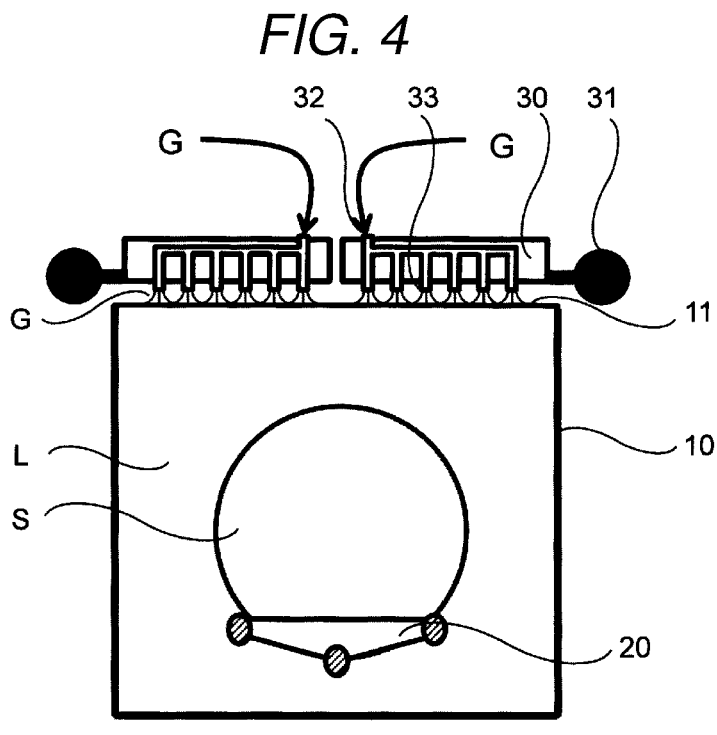
FIG. 4 is a diagram schematically illustrating aspects of a substrate processing method according to an embodiment.

Hereinafter, a substrate processing method using the substrate processing apparatus 1 according to the first embodiment will be described. The substrate processing method according to the first embodiment is, for example, a wet etching method in which a metal wiring on the surface of the substrate S is partially removed with the solution L, which contains an inorganic acid such as sulfuric acid, nitric acid, hydrochloric acid, and hydrofluoric acid, or an organic acid such as acetic acid and citric acid. However, the substrate processing method is not limited thereto, and for example, the substrate processing method may also be applied to a wet etching method in which silicon is etched by a solution L additionally containing hydrogen peroxide. FIGS. 3 and 4 are diagrams schematically illustrating the substrate processing method according to the first embodiment.

As illustrated in FIG. 3, the substrate S is placed vertically (the main surface of the substrate S is in an XZ plane) on the holding member 20. The substrate S is, for example, a semiconductor substrate such as a silicon wafer. The solution L has already been filled from the solution supply path 12 into the processing tank 10 up to the upper end opening 11 (or substantially thereto). Before the substrate S is immersed in the processing tank 10, the gas G may be supplied from the first bubble dispensing ports 33 with the lid 30 closed on a processing tank 10 filled with solution L but without a substate S therein to remove the dissolved oxygen from the solution L in advance of the substrate processing (etching). For example, before the substrate processing begins (that is, before the substrates are placed in the solution L), the gas G is preferably dispensed for 5 minutes or more. After this pre-processing or stabilization step, the holding member 20 (holding the substrate S) is then immersed in the solution L in the processing tank 10.

As illustrated in FIG. 4, the lid 30 is then closed so as to cover the upper end opening 11 of the processing tank 10. Since the lid 30 is positioned above the upper end opening 11, the lid 30 do not come into direct contact with the solution L. The gas G is, for example, a gas containing nitrogen. The gas G is dispensed from the first bubble dispensing ports 33 into the space above the solution L.

According to the substrate processing method using the substrate processing apparatus 1 of the first embodiment, the gas G is supplied from the first bubble dispensing ports 33 to the space above the solution L in the processing tank 10, so that oxygen in air does not dissolve into the solution L, and the amount of dissolved oxygen present in the solution L during the etching processing can be reduced. Therefore, uniformity of an etching rate in the substrate S can be improved, and surface oxidation of the substrate S can be prevented.

Second Embodiment

A configuration of a substrate processing apparatus according to the second embodiment is the same as the first embodiment except for the shape and disposition of a lid. [Configuration of Substrate Processing Apparatus]

Figure 5:
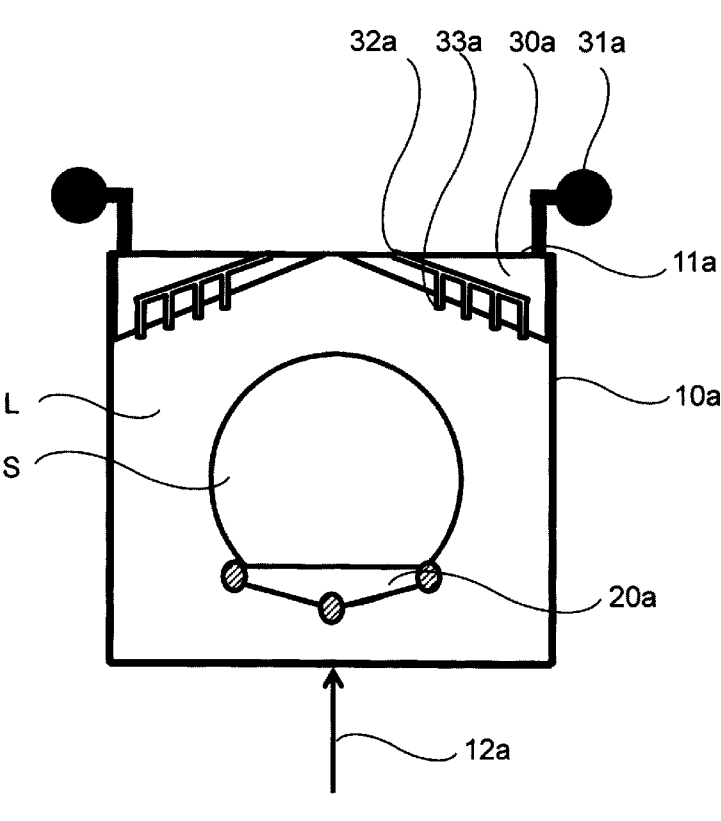
FIG. 5 is a diagram schematically illustrating a substrate processing apparatus according to an embodiment.
Figure 5:
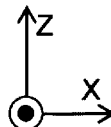
Figure 6:
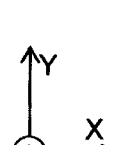
FIG. 6 is a top view schematically illustrating a structure of a substrate processing apparatus according to an embodiment.

FIG. 5 is a diagram schematically illustrating an overall configuration of the substrate processing apparatus according to the embodiment. FIG. 6 is a top view schematically illustrating a structure of the substrate processing apparatus according to the embodiment. As illustrated in FIG. 5, a substrate processing apparatus 1a includes a processing tank 10a, a holding member 20a, and a lid 30a.

The lid 30a is provided on the processing tank 10a. The lid 30a is implemented by two members, and has a double-opening structure that is opened and closed by rotating the two members in opposite directions (left and right directions on a paper surface) from a center with one side and the other side facing the one side of an upper end opening 11a as shafts 31a. However, the lid 30a is not limited thereto, and may have a single-opening structure that is opened and closed by rotating the lid 30a in a direction from the other side facing the one side of the upper end opening 11a to the one side with the one side as a shaft. The lid 30a has a gap between the two members. The lid 30a may be in contact with an inner side of the processing tank 10a on a shaft 31a side.

A lower surface (a surface on a processing tank 10a side) of the lid 30a is disposed below the upper end opening 11a of the processing tank 10a, and is in contact with the solution L stored in the processing tank 10a. The lower surface (the surface on the processing tank 10a side) of the lid 30a is disposed in the processing tank 10a with an inclination with respect to a horizontal direction (an XY direction). In FIG. 5, the lower surface (the surface on the processing tank 10a side) of the lid 30a is disposed such that the shaft 31a side is low in a vertical direction (a Z direction) and a central side is high in the vertical direction (the Z direction). However, the lower surface (the surface on the processing tank 10a side) of the lid 30a is not limited thereto, and may be disposed such that the shaft 31a side is high in the vertical direction (the Z direction) and the central side is low in the vertical direction (the Z direction) as long as the left and right parts or the lid 30a and the processing tank 10a do not interfere with each other. The inclination of the lower surface (the surface on the processing tank 10a side) of the lid 30a with respect to the horizontal direction (the XY direction) may be, for example, larger than 0° and equal to or smaller than 60°.

In FIG. 5, the lid 30a is implemented by a member having different thicknesses in the vertical direction (the Z direction). The lid 30a is implemented such that the shaft 31a side is thick in the vertical direction (the Z direction) and the central side is thin in the vertical direction (the Z direction). An upper surface (a surface on a side opposite to the processing tank 10a) of the lid 30a is disposed in the substantially horizontal direction (the XY direction) at the upper end opening 11a of the processing tank 10a. However, the lid 30a is not limited thereto, and may be implemented by a flat plate-shaped member having substantially the same thickness. In this case, the upper surface (the surface on the side opposite to the processing tank 10a) of the lid 30a may be disposed with an inclination with respect to the horizontal direction (the XY direction).

As illustrated in FIGS. 5 and 6, the lid 30a includes a first bubble dispensing pipe 32a. The first bubble dispensing pipe 32a is provided inside the lid 30a. The first bubble dispensing pipe 32a supplies the gas G into the processing tank 10a. The first bubble dispensing pipe 32a includes a plurality of first bubble dispensing ports 33a for supplying the gas G to the processing tank 10a. The plurality of first bubble dispensing ports 33a are disposed on the lower surface (the surface on the processing tank 10a side) of the lid 30a. The gas G is dispensed from the first bubble dispensing port 33a into the solution L stored in the processing tank 10a.

In FIG. 6, among the plurality of first bubble dispensing ports 33a, more first bubble dispensing ports 33a are disposed on the shaft 31a side than on the central side of the lid 30a. Among the plurality of first bubble dispensing ports 33a, more first bubble dispensing ports 33a are preferably arranged in a region where the lower surface (the surface on the processing tank 10a side) of the lid 30a is low in the vertical direction (the Z direction) than in a region where the lower surface of the lid 30a is high in the vertical direction (the Z direction). However, the number, size, and arrangement of the first bubble dispensing ports 33a are not particularly limited. It is sufficient if the gas G can be uniformly supplied under a liquid surface of the solution L.

The gas G supplied from the first bubble dispensing pipe 32a may be, for example, a gas containing nitrogen. Among the plurality of first bubble dispensing ports 33a, more first bubble dispensing ports 33a are preferably arranged in a region where the lower surface (the surface on the processing tank 10a side) of the lid 30a is low in the vertical direction (the Z direction) than in a region where the lower surface of the lid 30a is high in the vertical direction (the Z direction). Each of the first bubble dispensing ports 33a may supply the gas G to the processing tank 10a at substantially the same flow rate. However, the first bubble dispensing ports 33a are not limited thereto, and may supply the gas G to the processing tank 10a at different flow rates depending on the arrangement of the first bubble dispensing ports 33a with respect to the substrate S or the lid 30a.

With the above configuration, the gas G supplied into the solution L in the region where the lower surface (the surface on the processing tank 10a side) of the lid 30a is low in the vertical direction (the Z direction) moves to the region where the lower surface of the lid 30a is high in the vertical direction (the Z direction) along the inclination of the lower surface (the surface on the processing tank 10a side) of the lid 30a, and is discharged from the gap between the two members.

According to the substrate processing apparatus 1a of the second embodiment, the gas G is supplied from the first bubble dispensing port 33a into the solution L stored in the processing tank 10a, so that oxygen dissolved in the solution L from the air or otherwise can be replaced with the gas G, and an amount of dissolved oxygen in the solution L can be reduced. Further, since the lid 30a is in contact with the liquid surface of the solution L, the dissolving oxygen from the air above the liquid surface (headspace region) into the solution L can be prevented, and the amount of the dissolved oxygen in the solution L during etching processing can be reduced. Therefore, uniformity of an etching rate in the substrate S can be improved, and surface oxidation of the substrate S can be prevented.

[Substrate Processing Method 1]

Figures 7, 8:
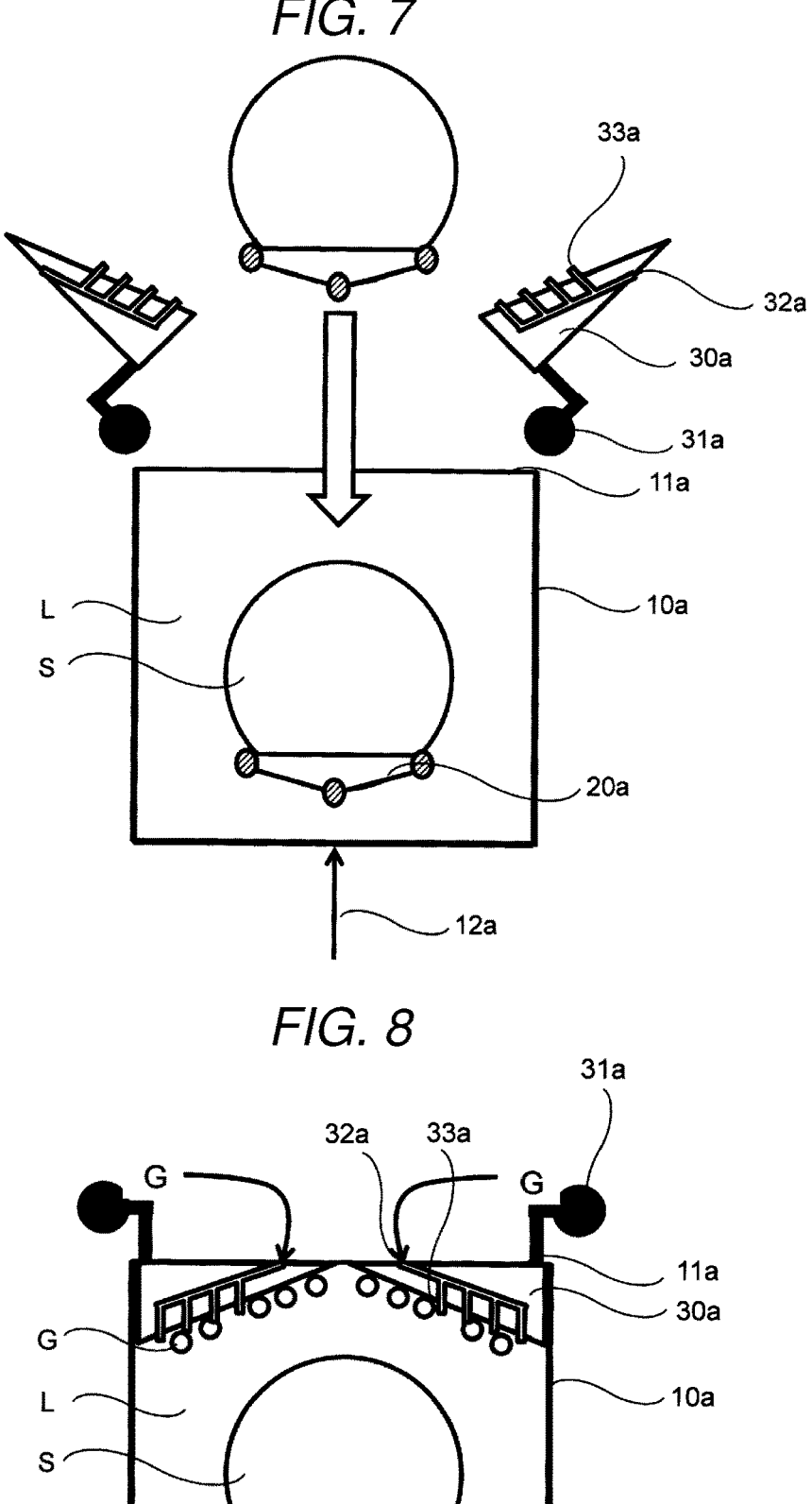
FIG. 7 is a diagram schematically illustrating aspects of a substrate processing method according to an embodiment.
FIG. 8 is a diagram schematically illustrating aspects of a substrate processing method according to an embodiment.

Hereinafter, a substrate processing method using the substrate processing apparatus 1a according to the second embodiment will be described. The substrate processing method according to this embodiment is performed, for example, in manufacturing a semiconductor device such as a three-dimensional NAND. FIGS. 7 and 8 are diagrams schematically illustrating the substrate processing method according to the second embodiment.

As illustrated in FIG. 7, the substrate S is placed vertically (a main surface is in an XZ plane) on the holding member 20a. The solution L from a solution supply path 12a is stored inside the processing tank 10a up to the upper end opening 11a. Before the substrate S is immersed in the processing tank 10a, the gas G may be supplied from the first bubble dispensing ports 33a with the lid 30a closed on a processing tank 10a filled with solution L but without a substate S therein to remove the dissolved oxygen from the solution L in advance of the substrate processing (etching). For example, before the substrate processing begins (that is, before the substrates are placed in the solution L), the gas G is preferably dispensed for 5 minutes or more. After this pre-processing or stabilization step, the holding member 20a (holding the substrate S) is then immersed in the solution L in the processing tank 10a.

As illustrated in FIG. 8, the lid 30a is closed such that the lower surface (the surface on the processing tank 10a side) of the lid 30a is inside the processing tank 10a. Since the two members of the lid 30a are not simultaneously closed, the two members are opened and closed one by one. Since the lower surface (the surface on processing tank 10a side) of the lid 30a is disposed below the upper end opening 11a of the processing tank 10a, the lower surface of the lid 30a comes into contact with the solution L. The gas G is supplied from the first bubble dispensing ports 33a of the first bubble dispensing pipe 32a into the solution L inside the processing tank 10a. The gas G may be, for example, a gas containing nitrogen. The gas G is dispensed from the first bubble dispensing port 33a into the solution L stored in the processing tank 10a. The gas G supplied into the solution L in the region where the lower surface (the surface on the processing tank 10a side) of the lid 30a is low in the vertical direction (the Z direction) moves to the region where the lower surface of the lid 30a is high in the vertical direction (the Z direction) along the inclination of the lower surface (the surface on the processing tank 10a side) of the lid 30a, and is discharged from the gap between the two members.

According to the substrate processing method using the substrate processing apparatus 1a of the present embodiment, the gas G is supplied from the first bubble dispensing port 33a into the solution L stored in the processing tank 10a, so that oxygen derived from air and dissolved in the solution L from the liquid surface can be replaced with the gas G, and an amount of dissolved oxygen in the solution L can be reduced. Further, since the lid 30a is in contact with the liquid surface of the solution L, the dissolving of oxygen from the air above the liquid surface into the solution L can be prevented, and the amount of the dissolved oxygen in the solution L during etching processing can be reduced. Therefore, uniformity of an etching rate in the substrate S can be improved, and surface oxidation of the substrate S can be prevented.

[Substrate Processing Method 2]

Figure 9:
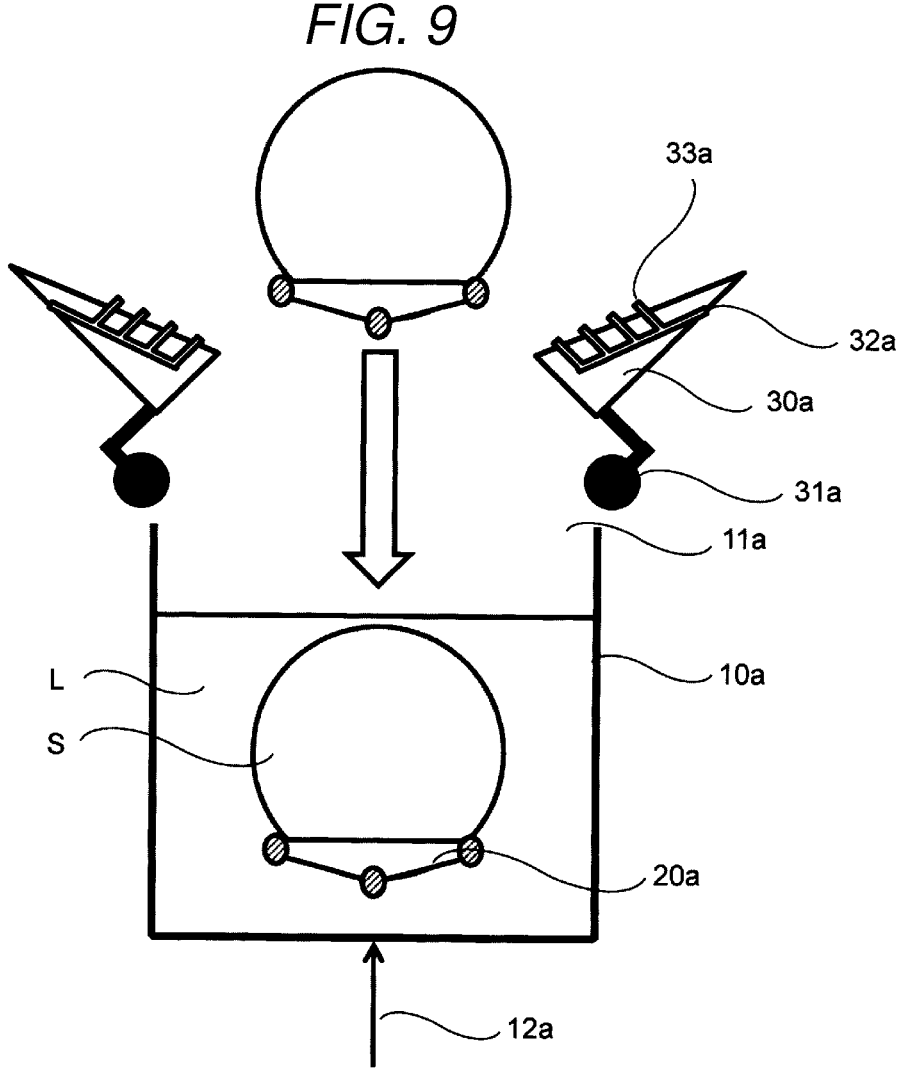
FIG. 9 is a diagram schematically illustrating a substrate processing method according to a modification.
Figure 10:
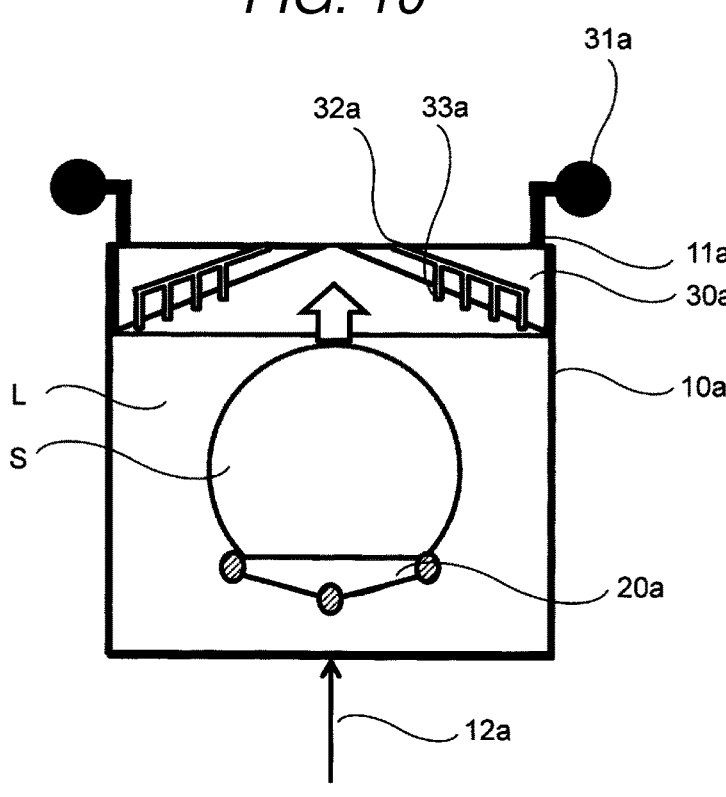
FIG. 10 is a diagram schematically illustrating the substrate processing method according to the modification.

Hereinafter, a modification of the substrate processing method using the substrate processing apparatus 1a according to the second embodiment will be described. The substrate processing method according to the present modification is the same as the substrate processing method according to the second embodiment except for the timing of supplying the solution L. FIGS. 9 and 10 are diagrams schematically illustrating the substrate processing method according to the modification.

As illustrated in FIG. 9, the substrate S is placed vertically (the main surface is in an XZ plane) on the holding member 20a. The solution L from the solution supply path 12a is stored halfway up the inside the processing tank 10a. Before the substrate S is immersed in the processing tank 10a, the gas G may be supplied from the first bubble dispensing ports 33a with the lid 30a closed on a processing tank 10a filled with solution L but without a substate S therein to remove the dissolved oxygen from the solution L in advance of the substrate processing (etching). For example, before the substrate processing begins (that is, before the substrates are placed in the solution L), the gas G is preferably dispensed for 5 minutes or more. After this pre-processing or stabilization step, the holding member 20a (holding the substrate S) is then immersed in the solution L in the processing tank 10a.

As illustrated in FIG. 10, the lid 30a is closed such that the lower surface (the surface on the processing tank 10a side) of the lid 30a is left substantially untouched by the solution L inside the processing tank 10a at the time of closing. Since the two members of the lid 30a do not have to be simultaneously closed in this modification, the two members may be opened and closed one at a time. Since the solution L is initially stored only halfway up the inside of the processing tank 10a, even when substrate S is placed in the processing tank 10a and the lid 30a is closed, the lower surface (the surface on the processing tank 10a side) of the lid 30a does not come into contact with the solution L at this time. After the lid 30a is closed, the solution L is filled additionally from the solution supply path 12a into the processing tank 10a to fill the inside the processing tank 10a up to the upper end opening 11a. Since the lower surface (the surface on processing tank 10a side) of the lid 30a is disposed below the upper end opening 11a, the lower surface of the lid 30a comes into contact with the solution L at this time.

According to the substrate processing method using the substrate processing apparatus 1a of the present modification, the solution L is stored up to the upper end opening 11a inside the processing tank 10a after the lid 30a is closed, whereby the solution L can be prevented from splashing out of the processing tank 10a when the lid 30a is being closed.

Third Embodiment

A configuration of a substrate processing apparatus according to the third embodiment is the same as the second embodiment except that a processing tank further includes a second bubble dispensing pipe.

[Configuration of Substrate Processing Apparatus]

Figure 11:
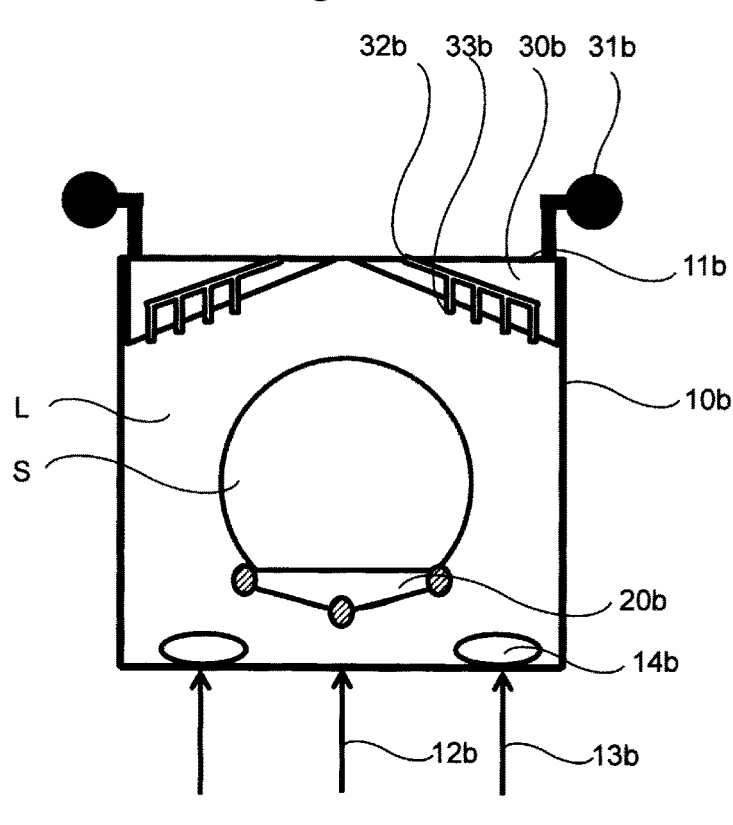
FIG. 11 is a diagram schematically illustrating a substrate processing apparatus according to an embodiment.
Figure 11:
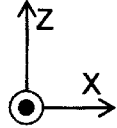

FIG. 11 is a diagram schematically illustrating an overall configuration of the substrate processing apparatus according to the third embodiment. As illustrated in FIG. 11, a substrate processing apparatus 1b includes a processing tank 10b, a holding member 20b, and a lid 30b.

A bottom portion of the processing tank 10b is provided with a second bubble dispensing pipe 13b. The second bubble dispensing pipe 13b supplies the gas G to the solution L in the processing tank 10b. The second bubble dispensing pipe 13b includes second bubble dispensing ports 14b for supplying the gas G to the processing tank 10b. The second bubble dispensing ports 14b are disposed below the holding member 20b. The gas G is dispensed from the second bubble dispensing ports 14b into the solution L in the processing tank 10b. The second bubble dispensing ports 14b are preferably disposed to be below the holding member 20b. The second bubble dispensing ports 14b may be disposed at the same height as that of a solution dispensing port 12b, or the second bubble dispensing ports 14b may be disposed at a height higher than the solution dispensing port 12b. The number, size, and disposition of the second bubble dispensing ports 14b are not particularly limited. It is sufficient if the gas G can be supplied to the solution L in generally uniform manner.

The gas G supplied from the second bubble dispensing pipe 13b may be, for example, a gas containing nitrogen. However, the gas G is not limited thereto, and may be another inert gas. Each of the second bubble dispensing ports 14b may supply the gas G to the processing tank 10b at substantially the same flow rate. However, the second bubble dispensing ports 14b are not limited thereto, and may supply the gas G to the processing tank 10b at different flow rates depending on the disposition with respect to the substrates S.

With the above configuration, bubbles (the gas G) supplied by the second bubble dispensing pipe 13b can pass between the substrates S from the bottom portion of the processing tank 10b, and can promote a flow (mixing) of the solution L.

According to the substrate processing apparatus 1b of the third embodiment, the bubbles (the gas G) supplied by the second bubble dispensing pipe 13b can pass between the substrates S from the bottom portion of the processing tank 10b, and the flow of the solution L can be promoted, so that oxygen dissolved in the solution L can be efficiently replaced with the gas G, and an amount of dissolved oxygen in the solution L can be further reduced. Therefore, uniformity of an etching rate in the substrate S can be improved, and surface oxidation of the substrate S can be prevented.

[Substrate Processing Method]

Figure 12:
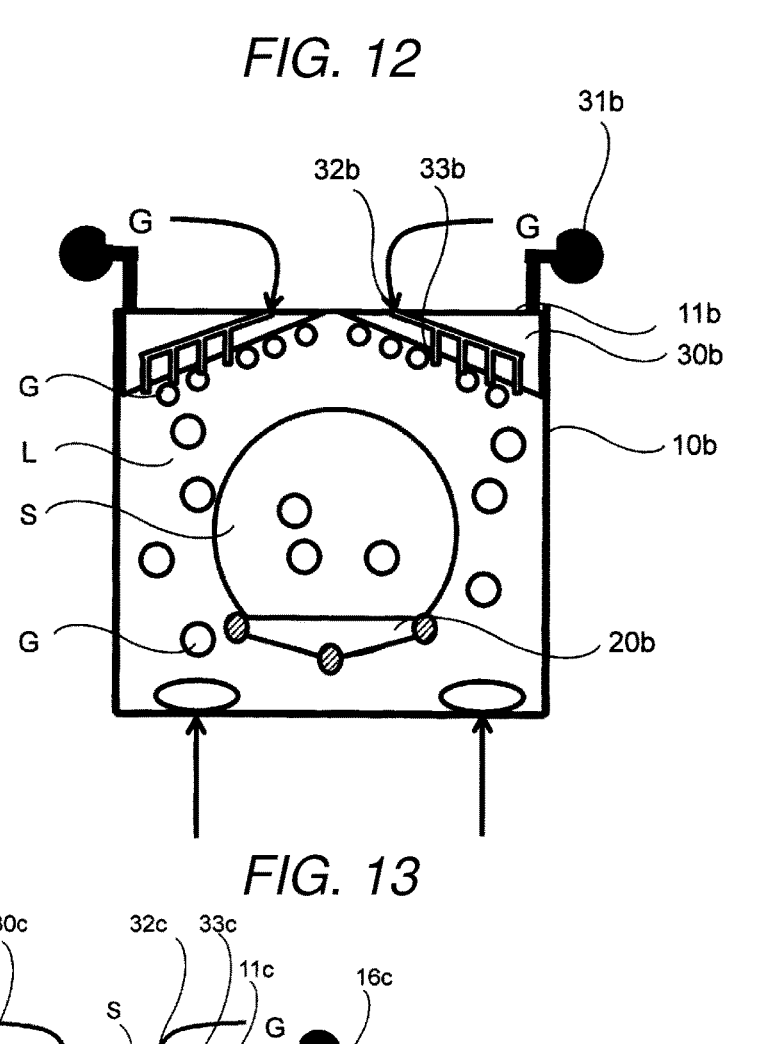
FIG. 12 is a diagram schematically illustrating a substrate processing method according to an embodiment.

Hereinafter, a substrate processing method using the substrate processing apparatus 1b according to the third embodiment will be described. The substrate processing method according to the third embodiment is the same as the substrate processing method according to the second embodiment except that the gas G is supplied from the second bubble dispensing pipe 13b. FIG. 12 is a diagram schematically illustrating the substrate processing method according to the embodiment.

As illustrated in FIG. 12, the gas G is supplied into the solution L from the first bubble dispensing port 33b disposed on the lid 30b, and the gas G is supplied into the solution L from the second bubble dispensing port 14b disposed in the bottom portion of the processing tank 10b. The gas G is, for example, nitrogen. The gas G is dispensed from the first bubble dispensing port 33b and the second bubble dispensing port 14b into the solution L in the processing tank 10b. The gas G supplied by the second bubble dispensing port 14b from the bottom portion of the processing tank 10b passes between the substrates S and promotes the flow (mixing) of the solution L. Before the substrate S is immersed in the processing tank 10b, the gas G may be supplied from the first bubble dispensing port(s) 33b and/or the second bubble dispensing port(s) 14b with the lid 30b closed on a processing tank 10b filled with solution L but without a substate S therein to remove the dissolved oxygen from the solution L in advance of the substrate processing (etching). For example, before the substrate processing begins (that is, before the substrates are placed in the solution L), the gas G is preferably dispensed for 5 minutes or more. After this pre-processing or stabilization step, the holding member 20b (holding the substrate S) is then immersed in the solution L in the processing tank 10b.

According to the substrate processing method using the substrate processing apparatus 1b of the third embodiment, the bubbles (the gas G) supplied by the second bubble dispensing pipe 13b can pass between the substrates S from the bottom portion of the processing tank 10b, and the flow of the solution L can be promoted, so that oxygen dissolved in the solution L can be efficiently replaced with the gas G, and an amount of the dissolved oxygen in the solution L can be further reduced. Therefore, uniformity of an etching rate in the substrate S can be improved, and surface oxidation of the substrate S can be prevented.

Fourth Embodiment

A configuration of a substrate processing apparatus according to the fourth embodiment is the same as the third embodiment except that a circulation line for the solution L is provided.

[Configuration of Substrate Processing Apparatus]

Figure 13:
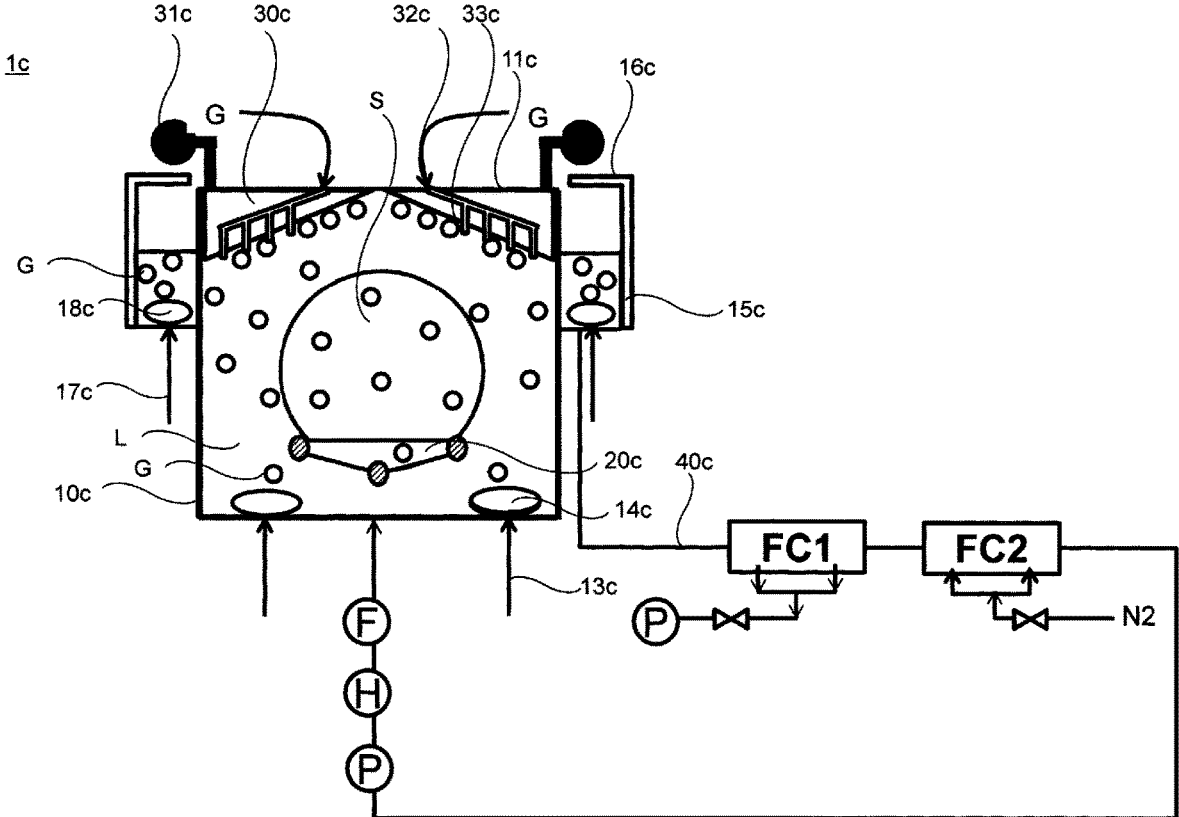
FIG. 13 is a diagram schematically illustrating a substrate processing apparatus according to an embodiment.
Figure 14:
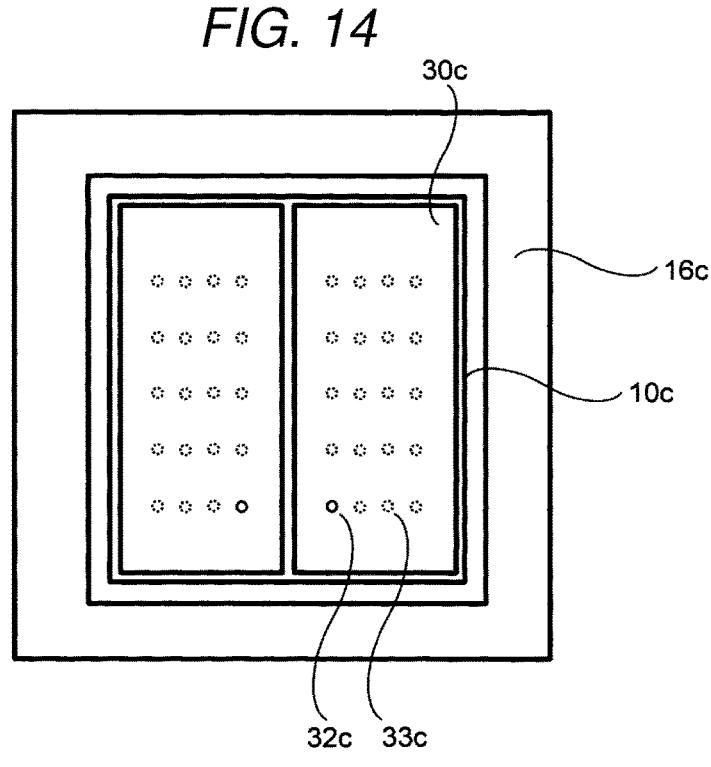
FIG. 14 is a top view schematically illustrating a structure of the substrate processing apparatus according to an embodiment.

FIG. 13 is a diagram schematically illustrating an overall configuration of the substrate processing apparatus 1c according to the fourth embodiment. FIG. 14 is a top view schematically illustrating a structure of the substrate processing apparatus 1c according to the fourth embodiment. As illustrated in FIG. 13, a substrate processing apparatus 1c includes a processing tank 10c, a holding member 20c, a lid 30c, and a circulation path 40c.

As illustrated in FIGS. 13 and 14, the processing tank 10c further includes an outer tank 15c. The outer tank 15c surrounds an entire periphery of an upper end opening 11c of the processing tank 10c. In FIG. 14, the depiction of the shafts 31c is omitted in order to more clearly illustrate a relation between the upper end opening 11c of the processing tank 10c and the outer tank 15c. The outer tank 15c includes an outer tank cover 16c at an upper portion thereof. There is a gap between the outer tank cover 16c and the upper end opening 11c of the processing tank 10c. The outer tank 15c collects the solution L overflowing from the upper end opening 11c of the processing tank 10c into this gap.

A bottom portion of the outer tank 15c is connected to a third bubble dispensing pipe 17c. The third bubble dispensing pipe 17c supplies the gas G into the solution L in the outer tank 15c. The third bubble dispensing pipe 17c includes third bubble dispensing ports 18c for supplying the gas G to the outer tank 15c. The gas G is dispensed from the third bubble dispensing port 18c into the solution L in the outer tank 15c. The number, size, and disposition of the third bubble dispensing ports 18c are not particularly limited. It is generally sufficient if the gas G can be uniformly supplied to the solution L.

The gas G supplied from the third bubble dispensing ports 18c may be, for example, a gas containing nitrogen. The gas G is not limited thereto, and may be another inert gas. Each of third bubble dispensing ports 18c may supply the gas G to the processing tank 10c at substantially the same flow rate. However, the arrangement of third bubble dispensing ports 18c is not limited thereto, and third bubble dispensing ports may supply the gas G to the outer tank 15c at different flow rates depending on the disposition with respect to the processing tank 10c.

The circulation path 40c is connected to the bottom portion of the outer tank 15c and a bottom portion of the processing tank 10c to circulate the solution L. Specifically, in the circulation path 40c, the solution L overflowing into the outer tank 15c is refluxed (recirculated) back to the processing tank 10c. In a reflux process, the solution L passes through a filter cartridge FC1, a filter cartridge FC2, a pump P, a heating unit H, and a filter F in this order.

The filter cartridge FC1 and the filter cartridge FC2 are provided upstream of the pump P in the circulation path 40c. The filter cartridge FC1 and the filter cartridge FC2 are hollow fiber membranes, for example. The filter cartridge FC1 is connected to a vacuum pump, and functions to remove dissolved gas from the solution L in the circulation path 40c. The dissolved gas includes oxygen dissolved into the solution L from the air or the like. The filter cartridge FC2 functions to supply the gas G to the solution L in the circulation path 40c. The gas G may be, for example, nitrogen. The gas G is not limited thereto, and may be another inert gas. In FIG. 13, the filter cartridge FC1 and the filter cartridge FC2 are disposed in this order, but, in other examples, the filter cartridge FC1 and the filter cartridge FC2 may be disposed in a reverse order, that is, the filter cartridge FC2 may be upstream of the filter cartridge FC1. Although one set including the filter cartridge FC1 and the filter cartridge FC2 is depicted, the number of the filter cartridge FC1 and the number of the filter cartridge FC2 is not particularly limited. Although the filter cartridge FC1 and the filter cartridge FC2 are used together in this example, in other examples only the filter cartridge FC1 or only the filter cartridge FC2 might be used. The number of the filter cartridge FC1 relative to the number of the filter cartridge FC2 is not particularly limited.

The pump P is provided downstream of the filter cartridge FC1 and the filter cartridge FC2 in the circulation path 40c, but upstream of the heating unit H in the circulation path 40c. The pump P pumps the solution L from the outer tank 15c back towards the processing tank 10c (the inner tank), the solution L recovered from the outer tank 15c is moved to the heating unit H via the filter cartridge FC1 and the filter cartridge FC2. The pump P causes the heated solution L (heated by the heating unit H) to be supplied back to the processing tank 10c.

The heating unit H can be provided in the middle of the circulation path 40c. The heating unit H heats the solution L. The heating unit H is, for example, a line heater using a halogen lamp as a heat source. The solution L heated by the heating unit H is supplied into the processing tank 10c through the filter F.

The filter F is provided downstream of the heating unit H in the circulation path 40c. The filter F removes particles contained in the solution L on the circulation path 40c. The particles may be, for example, metal or silica dissolved or entrained in the solution L during etching processing of the substrate S. The filter F may be provided upstream of the heating unit H in the circulation path 40c in other examples.

According to the substrate processing apparatus 1c of the fourth embodiment, bubbles (the gas G) is supplied from the bottom portion of the outer tank 15c by the third bubble dispensing pipe 17c, so that oxygen dissolved in the solution L recovered from the processing tank 10c can be replaced with the gas G, and an amount of dissolved oxygen in the refluxing solution L can be reduced. By providing the outer tank cover 16c in the upper portion of the outer tank 15c, the dissolving of oxygen from the air above the liquid surface into the solution L can be prevented. Further, by performing degassing and intaking liquid via the filter cartridge FC1 and the filter cartridge FC2 in the circulation path 40c, oxygen from the air and dissolved in the refluxing solution L can be efficiently replaced by the gas G, and the amount of the dissolved oxygen in the solution L can be further reduced. Therefore, uniformity of an etching rate in the substrate S can be improved, and surface oxidation of the substrate S can be prevented.

Fifth Embodiment

A configuration of a substrate processing apparatus according to the fifth embodiment is the same as the fourth embodiment except that chemical solution preparation tanks 41d, 42d, 43d, 44d, and 45d are provided instead of the filter cartridge FC1 and the filter cartridge FC2.

[Configuration of Substrate Processing Apparatus]

Figure 15:
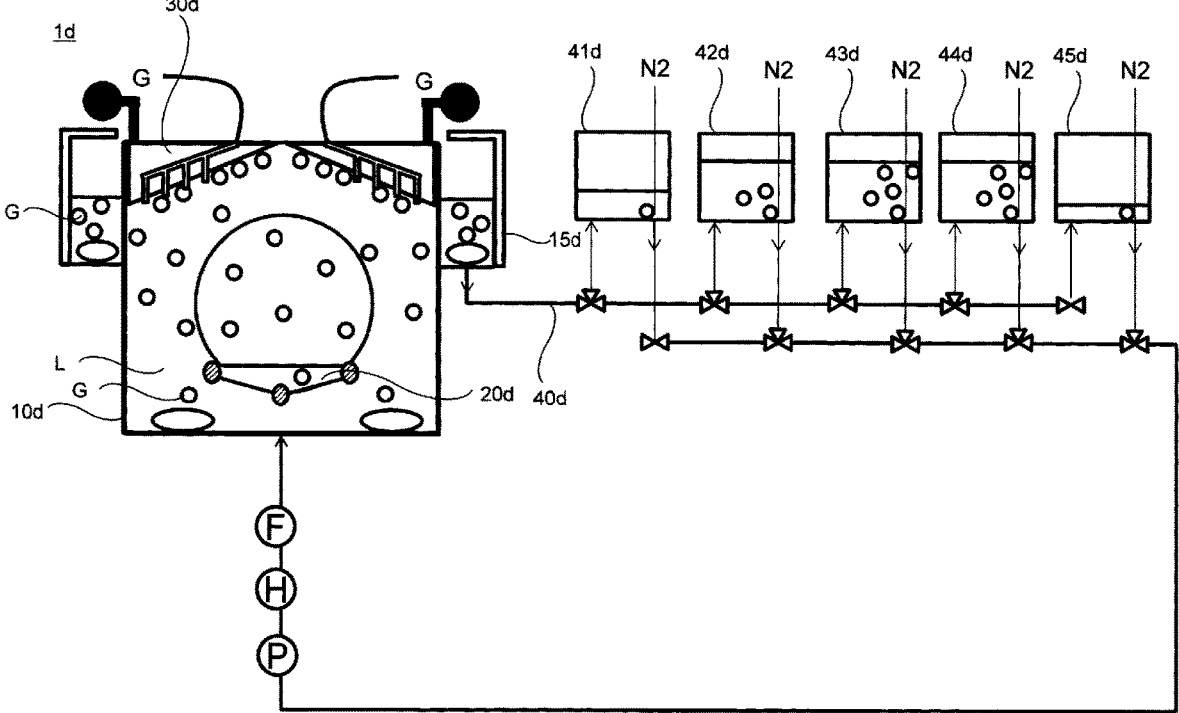
FIG. 15 is a diagram schematically illustrating a substrate processing apparatus according to an embodiment.

FIG. 15 is a diagram schematically illustrating an overall configuration of the substrate processing apparatus 1d according to the embodiment. As illustrated in FIG. 15, a substrate processing apparatus 1d includes a processing tank 10d, a holding member 20d, a lid 30d, and a circulation path 40d.

The circulation path 40d is connected to a bottom portion of an outer tank 15d and a bottom portion of the processing tank 10d to circulate the solution L. Specifically, in the circulation path 40d, the solution L flowing out to the outer tank 15d is refluxed back to the processing tank 10d. In the reflux process, the solution L passes through the chemical solution preparation tanks 41d, 42d, 43d, 44d, and 45d, the pump P, the heating unit H, and the filter F in this order.

The chemical solution preparation tanks 41d, 42d, 43d, 44d, and 45d are provided upstream of the pump P in the circulation path 40d. The chemical solution preparation tanks 41d, 42d, 43d, 44d, and 45d are each smaller in capacity (size/volume) than the processing tank 10d, and the gas G is added separately in each chemical solution preparation tank 41d, 42d, 43d, 44d, and 45d. The solution L refluxing in the circulation path 40d is supplied in turn to each of chemical solution preparation tanks 41d, 42d, 43d, 44d, and 45d such that the first tank (41d) is filled, then the second tank (42d), etc. When the solution L starts to enter the chemical solution preparation tank 45d (the last tank), the solution L begins to be supplied from the chemical solution preparation tank 41d back to the circulation path 40d simultaneously. In each of the chemical solution preparation tanks 41d, 42d, 43d, 44d, 45d, the gas G is added into the tank for at least 10 minutes. The gas G may be, for example, nitrogen. The gas G is not limited thereto, and may be another inert gas. In FIG. 15, five chemical solution preparation tanks are provided, but the number of chemical solution preparation tanks is not particularly limited. The chemical solution tanks 41*d*, 42*d*, 43*d*, 44*d*, 45*d* may be referred to as resting tanks, settling tanks, or the like.

According to the substrate processing apparatus 1*d* of the fifth embodiment, the gas G is added in the chemical solution preparation tanks 41*d*, 42*d*, 43*d*, 44*d*, and 45*d* along the circulation path 40*d*, so that oxygen dissolved in the refluxing solution L can be efficiently replaced with the gas G, and an amount of dissolved oxygen in the solution L can be further reduced. Therefore, uniformity of an etching rate in the substrate S can be improved, and surface oxidation of the substrate S can be prevented.

<Modifications>

Figure 16:
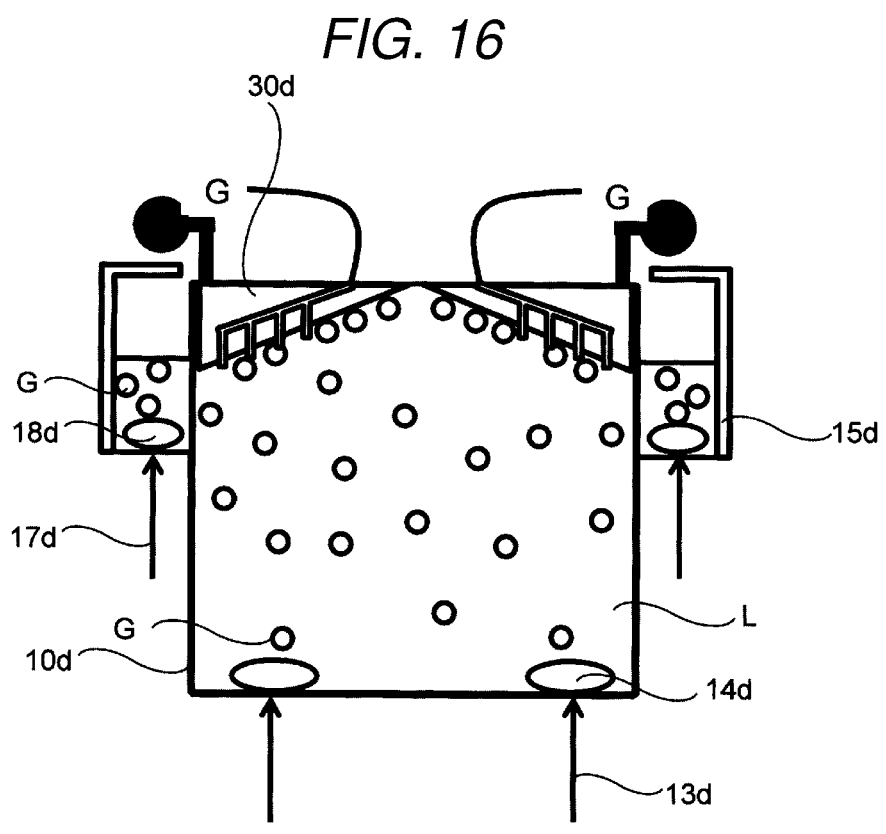
FIG. 16 is a diagram schematically illustrating a substrate processing method according to a modification.

Hereinafter, a modification of a substrate processing method using the substrate processing apparatus 1*d* according to the fifth embodiment will be described. The substrate processing method according to the present modification is the same as a substrate processing method according to the fifth embodiment except that the gas G is added before the substrate S is placed in the processing tank 10*d*. FIG. 16 is a diagram schematically illustrating the substrate processing method according to the modification.

As illustrated in FIG. 16, first, the gas G is added to the processing tank 10*d* and the outer tank 15*d* before the substrate S has been placed therein. In the processing tank 10*d* and the outer tank 15*d*, the gas G is added for at least 5 minutes before the substrate S is immersed, and can also be continuously added while the substrate S is being immersed. The gas G may be, for example, nitrogen. However, the gas G is not limited thereto, and may be another inert gas.

According to the substrate processing method using the substrate processing apparatus 1*d* of the present modification, the gas G is added to the solution L before the substrate S is placed therein, so that an amount of the dissolved oxygen in the solution L can be further reduced.

The substrate processing apparatuses and the substrate processing methods according to the first to fifth embodiments described above may be appropriately combined with one another. For example, the configurations of the substrate processing apparatuses according to the third to fifth embodiments may be applied to the configuration of the substrate processing apparatus according to the first embodiment.

The substrate processing methods according to the first to fifth embodiments may be used, for example, as a part of a method for manufacturing a semiconductor device. Examples of the semiconductor device include, but are not particularly limited to, a three-dimensional NAND flash memory.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing apparatus, comprising:
a processing tank configured to store a chemical solution to process a substrate by immersion of the substrate in the chemical solution;
a holder configured to hold the substrate while immersed in the chemical solution;
a lid disposed on processing tank for opening and closing an upper end of the processing tank;
a first bubble dispensing pipe in the lid, the first bubble dispensing pipe being configured to dispense a gas into the processing tank from the lid;
an outer overflow tank surrounding the processing tank at an upper end of the processing tank;
a second bubble dispensing pipe with a gas outlet port on a bottom surface of the outer overflow tank; and
a third bubble dispensing pipe with a gas outlet port at a bottom surface of the processing tank and a recirculating path connected between the bottom surface of the outer overflow tank and the bottom surface of the processing tank, wherein
the lid comprises a first portion hinged at one side of the processing tank and a second portion hinged at an opposite side of the processing tank from the first portion,
the first and second portions directly contact the chemical solution stored in the processing tank when the lid is closed, and
when the lid is closed, the first portion angles upward from the one side of the processing tank toward a middle of the processing tank, and the second portion angles upward from the opposite side of the processing tank toward the middle of the processing tank;
wherein bottom surfaces of each of the first and second portions of the lid have gas outlets therein connected to the first bubble dispensing pipe.

2. The substrate processing apparatus according to claim 1, further comprising:
the recirculating path configured to return chemical solution from the outer overflow tank to the processing tank.

3. The substrate processing apparatus according to claim 2, wherein the recirculating path includes a filter cartridge thereon, the filter cartridge configured to supply an inert gas to the chemical solution on the recirculating path.

4. The substrate processing apparatus according to claim 2, wherein the recirculating path includes a heater thereon, the heater configured to heat the chemical solution on the recirculating path.

5. The substrate processing apparatus according to claim 2, wherein the recirculating path includes at least one resting tank thereon, an inert gas being supplied to the resting tank.

6. The substrate processing apparatus according to claim 1, wherein the first bubble dispensing pipe has a plurality of gas outlets in a bottom surface of the lid.

7. The substrate processing apparatus according to claim 1, wherein
the holder is configured to hold a plurality of substrates at the same time, and
the plurality of substrate are each held to be parallel to a vertical direction while immersed in the processing tank.

8. A substrate processing apparatus, comprising:
a processing tank configured to store a chemical solution to process a substrate by immersion of the substrate in the chemical solution;
a holder configured to hold the substrate while immersed in the chemical solution;

a lid disposed on processing tank for opening and closing an upper end of the processing tank, the lid having a first portion hinged to a first side of the processing tank and second portion hinged to a second side of the processing tank opposite to the first side;

a first bubble dispensing pipe, the first bubble dispensing pipe being configured to dispense a gas into the processing tank from the lid;

an outer overflow tank surrounding the processing tank at an upper end of the processing tank; and a second bubble dispensing pipe with a gas outlet port on a bottom surface of the outer overflow tank, a third bubble dispensing pipe with a gas outlet port at a bottom surface of the processing tank and a recirculating path connected between the bottom surface of the outer overflow tank and the bottom surface of the processing tank, wherein a bottom surface of each of the first and second portions directly contacts the chemical solution stored in the processing tank when the lid is closed, the bottom surface of the first portion angles upward from the first side of the processing tank toward a middle of the processing tank, and the bottom surface of the second portion angles upward from the second side of the processing tank toward the middle of the processing tank;

wherein the bottom surfaces of each of the first and second portions of the lid have gas outlets therein connected to the first bubble dispensing pipe.

\* \* \* \* \*